United States Patent
Eguchi et al.

(10) Patent No.: US 10,225,970 B2
(45) Date of Patent: Mar. 5, 2019

(54) TAPE FEEDER AND COMPONENT MOUNTING DEVICE

(71) Applicant: Panasonic Intellectual Property Management Co., Ltd., Osaka (JP)

(72) Inventors: Ryouji Eguchi, Yamanashi (JP); Kazunori Kanai, Yamanashi (JP); Nobuto Yasuhira, Hyogo (JP); Tatsuo Yamamura, Fukuoka (JP); Minoru Kitani, Osaka (JP); Takashi Tamura, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 264 days.

(21) Appl. No.: 15/075,221

(22) Filed: Mar. 21, 2016

(65) Prior Publication Data
US 2016/0316592 A1    Oct. 27, 2016

(30) Foreign Application Priority Data

Apr. 27, 2015    (JP) ................. 2015-090151

(51) Int. Cl.
*H05K 13/02*    (2006.01)
*H05K 13/04*    (2006.01)

(52) U.S. Cl.
CPC ..... *H05K 13/0417* (2013.01); *H05K 13/0419* (2018.08)

(58) Field of Classification Search
CPC .... H05K 13/0417; H05K 13/02; H05K 13/04; H05K 13/046; Y10T 29/5374; Y10T 29/53174–29/53178; Y10T 29/5313; Y10T 29/53191

USPC .......................................... 29/729, 759, 760
See application file for complete search history.

(56) References Cited

U.S. PATENT DOCUMENTS

| | | | | |
|---|---|---|---|---|
| 5,053,103 A | * | 10/1991 | Fritsch | H05K 13/003 156/702 |
| 6,039,512 A | * | 3/2000 | Chooi | H05K 13/028 406/137 |
| 6,042,683 A | * | 3/2000 | Hagn | H01G 2/065 156/275.5 |
| 6,162,007 A | * | 12/2000 | Witte | B65H 20/22 414/416.01 |

(Continued)

FOREIGN PATENT DOCUMENTS

| JP | 2814525 B2 | 10/1998 |
|---|---|---|
| JP | 2006-100650 A | 4/2006 |

(Continued)

*Primary Examiner* — Peter DungBa Vo
*Assistant Examiner* — Kaying Kue
(74) *Attorney, Agent, or Firm* — Pearne & Gordon LLP (57) ABSTRACT

A tape feeder includes a gate, a gate drive mechanism, and a tape feed mechanism. The gate is provided in an insertion port through which a carrier tape storing components is inserted. In the gate drive mechanism, a tape feed mechanism which drives the gate in opening and closing directions feeds the components stored in the inserted carrier tape to a pickup position. The gate drive mechanism includes a spring member which biases the gate in the closing direction, and a solenoid which drives the gate in the opening direction against a biasing force of the spring member.

5 Claims, 10 Drawing Sheets

(56) References Cited

U.S. PATENT DOCUMENTS

| | | | |
|---|---|---|---|
| 6,782,606 B2* | 8/2004 | Bergstrom | H05K 13/087 29/740 |
| 7,073,696 B2* | 7/2006 | College | H05K 13/0417 226/139 |
| 7,228,620 B2* | 6/2007 | Bergstrom | H05K 13/0419 29/740 |
| 8,715,459 B2* | 5/2014 | Nagao | H05K 13/0419 156/714 |
| 9,310,789 B2* | 4/2016 | Shimizu | G05B 15/02 |
| 9,415,968 B2* | 8/2016 | Higuchi | B65H 37/002 |
| 9,580,264 B2* | 2/2017 | Yamasaki | H05K 13/0417 |
| 9,611,115 B2* | 4/2017 | Kawaguchi | H05K 13/0419 |
| 9,686,894 B2* | 6/2017 | Kanai | H05K 13/02 |
| 2011/0243695 A1 | 10/2011 | Hwang et al. | |
| 2012/0110841 A1* | 5/2012 | Kadota | G02F 1/1333 29/832 |
| 2012/0325885 A1* | 12/2012 | Nagao | H05K 13/0419 226/76 |
| 2013/0161371 A1* | 6/2013 | Nagao | H05K 13/0419 226/86 |
| 2018/0111775 A1* | 4/2018 | Chi | B65H 19/18 |

FOREIGN PATENT DOCUMENTS

| | | |
|---|---|---|
| JP | 2010-245385 A | 10/2010 |
| JP | 2011-159703 A | 8/2011 |
| JP | 2011-211169 | 10/2011 |

\* cited by examiner

FIG. 6A
UNENERGIZED STATE

FIG. 6B
ENERGIZED STATE

FIG. 6C

UNENERGIZED STATE

TAPE FEEDER AND COMPONENT MOUNTING DEVICE

BACKGROUND

1. Technical Field

The present disclosure relates to a tape feeder which pitch feeds a carrier tape in which components are stored, and to a component mounting device in which the tape feeder is disposed.

2. Description of the Related Art

A tape feeder is known as a supply device of components in a component mounting device. The tape feeder supplies an electronic component to a component suction position of a mounting head by pitch feeding a carrier tape holding the electronic component. In the related art, tape splicing in which a following new carrier tape (a following tape) is connected to a tail portion of a leading mounted carrier tape (a leading tape) is used as a method of continuing component supply without stopping a mounting operation in the tape feeder. In this tape splicing system, it is necessary for an operator to tackle troublesome tape splicing work every time the tape is replaced, and there is a demand to reduce this workload. Therefore, a tape feeder of a system in which a following tape is set in the tape feeder without performing the tape splicing work is used as a new tape replacement system. The technique is disclosed in Japanese Patent Unexamined Publication No. 2011-211169.

In the related art illustrated in Japanese Patent Unexamined Publication No. 2011-211169, a component feed drive section configured to drive a sprocket using a drive motor is disposed at each of a tape insertion section and a pickup section, and the leading tape and the following tape are caused to move separately, the tape insertion section being provided on a rear end portion of the tape feeder and the pickup section feeding the carrier tape to a component pickup position. In this case, the tape supply is performed without splicing the leading tape and the following tape.

SUMMARY

The present disclosure provides a tape feeder and a component mounting device capable of preventing erroneous setting of a carrier tape in a tape feeder in an unenergized state.

The tape feeder of the present disclosure includes a gate, a gate drive mechanism, and a tape feed mechanism. The gate is provided in an insertion port through which a carrier tape storing a component is inserted. The gate drive mechanism drives the gate in opening and closing directions. A tape feed mechanism feeds the component stored in the carrier tape inserted to a pickup position. The gate drive mechanism includes a spring member which biases the gate in the closing direction, and a solenoid which drives the gate in the opening direction against a biasing force of the spring member.

The component mounting device of the present disclosure includes the tape feeder described above and a component mounting mechanism which picks up the component from the tape feeder, moves the component to a substrate, and mounts the component on the substrate.

According to the present disclosure, it is possible to prevent the erroneous setting of the carrier tape to the tape feeder in the unenergized state.

DETAILED DESCRIPTION OF THE PREFERRED EMBODIMENT

Before describing the exemplary embodiment of the present disclosure, a concise description will be given of the problems in the component mounting device of the related art. In the related art, including the example patent literature described above, the following inconveniences arise when successively supplying the carrier tape to the tape feeder. In other words, in a system in which splicing is not performed, the leading tape and the following tape are not connected integrally. Therefore, when an external force acts on the following tape due to an inappropriate operation of an operator after the setting of the following tape, a failure occurs in which the set following tape disengages from the sprocket. During such a tape disengagement, when the tape feeder is provided with a disengagement detection function which performs notification of tape disengagement, the operator receives the notification, and thus sets the disengaged following tape on the tape feeder again.

However, the disengagement detection function described above functions in a state in which power is being supplied to the tape feeder. For example, a case in which the tape feeder is set in the component mounting device, or, a case in which the tape feeder is connected to a power source in a predetermined working area corresponds to this state. Therefore, the operator may accidentally set the disengaged carrier tape in a tape feeder to which the carrier tape should not ordinarily be mounted in a state in which the power is not being supplied to the tape feeder. In the related art, there is no countermeasure preventing such a mistake in the work caused by carelessness of the operator, and a failure such as the device stopping or a mounting error due to the wrong component being supplied occurs.

Hereinafter, description will be given of the exemplary embodiment of the present disclosure, with reference to the drawings. First, description will be given of the configuration of component mounting device 1 which mounts components on a substrate, with reference to FIGS. 1 and 2. Component mounting device 1 includes a function of mounting an electronic component on a substrate, and FIG. 2 partially illustrates the cross-section taken along line II-II in FIG. 1.

Figure 1:
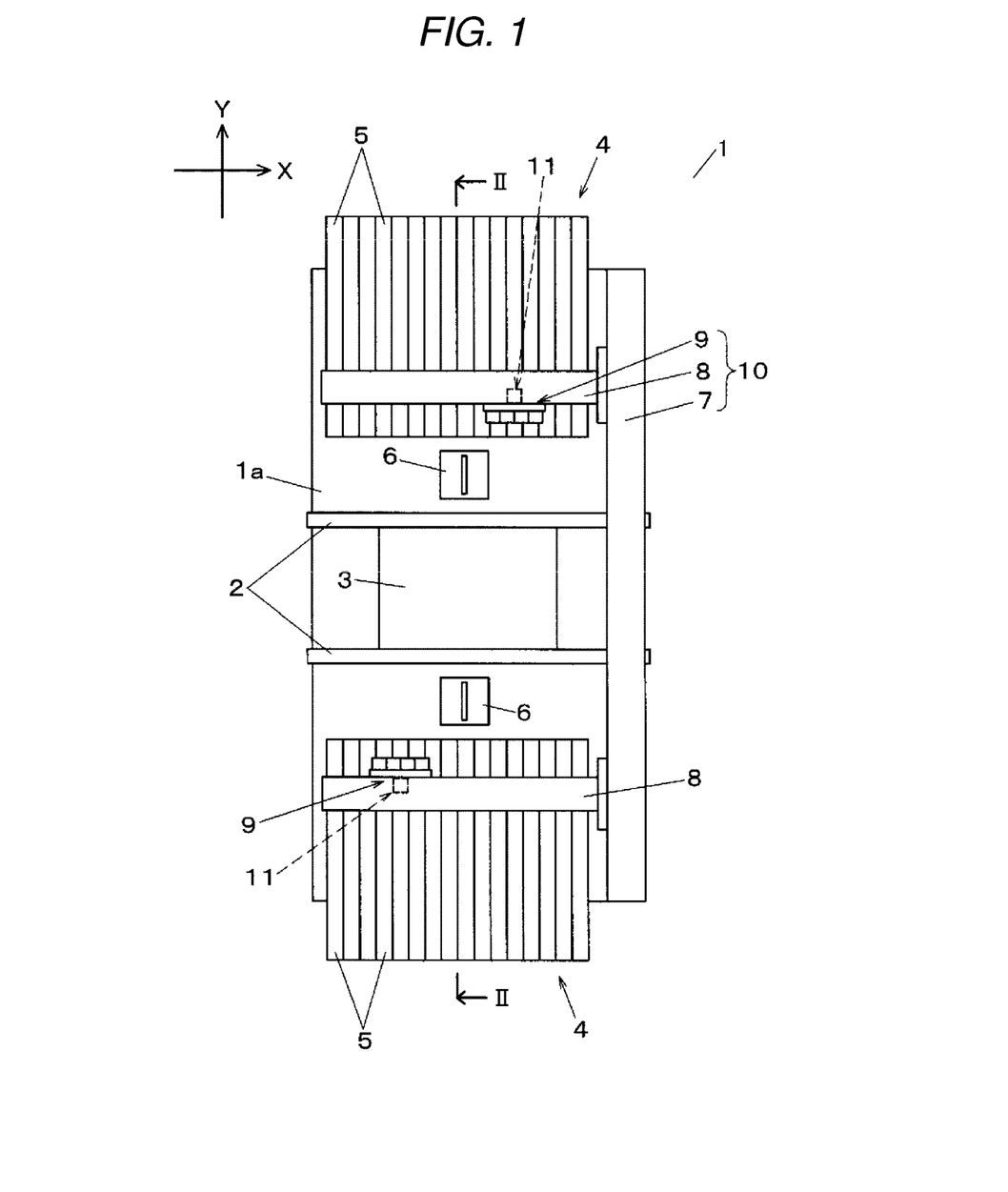
FIG. 1 is a plan view of a component mounting device of an embodiment of the present disclosure.

In FIG. 1, substrate conveyance mechanism 2 is arranged in the X direction (the substrate conveyance direction) in the center of base 1a. Substrate conveyance mechanism 2 conveys substrate 3 which is carried in from the upstream side, and positions and holds substrate 3 on a mounting stage which is set in order to execute component mounting work.

Component supply sections 4 are disposed on either side of substrate conveyance mechanism 2, and a plurality of tape feeders 5 is mounted in parallel in each component supply section 4. Tape feeder 5 supplies a component to a component suction position of a mounting head of a component mounting mechanism described hereinafter by pitch feeding a carrier tape storing components in a tape feed direction, that is, in a direction from the outside of component supply section 4 toward substrate conveyance mechanism 2.

Figure 2:
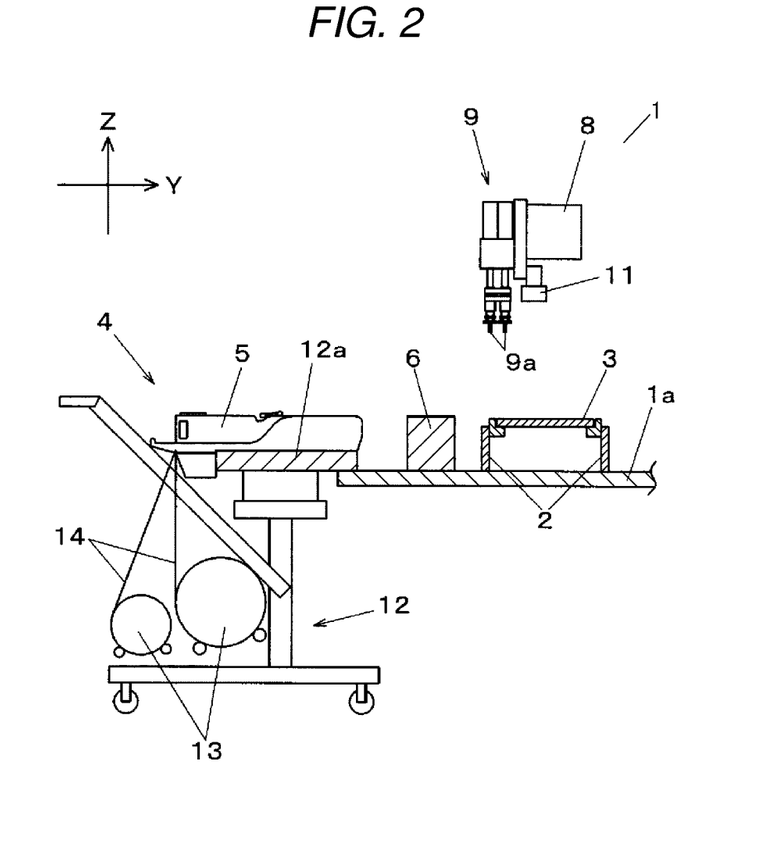
FIG. 2 is a partial cross-sectional view of the component mounting device of the embodiment of the present disclosure.

Y-axis movement beam 7 provided with a linear drive mechanism is arranged in the Y direction which orthogonally intersects the X direction on an end portion of one side in the X direction on the top surface of base 1a, and two X-axis movement beams 8, provided with linear motors in a similar manner, are joined to Y-axis movement beam 7 to be freely movable in the Y direction. Mounting head 9 is mounted on each of two X-axis movement beams 8 to be freely movable in the X direction. Mounting head 9 is a multi-head provided with a plurality of holding heads, and, as illustrated in FIG. 2, suction nozzles 9a capable of sucking and holding components and being lifted and lowered separately are mounted to the bottom end portion of each holding head.

Mounting head 9 moves in the X direction and the Y direction due to Y-axis movement beam 7 and X-axis movement beam 8 being driven. Accordingly, using suction nozzles 9a, two mounting heads 9 suck, hold, and pick up components from the component suction positions of tape feeders 5 of component supply sections 4 corresponding to each mounting head 9, move and mount the components on mounting points on substrate 3 which is positioned in substrate conveyance mechanism 2. Y-axis movement beam 7, X-axis movement beams 8, and mounting head 9 form component mounting mechanism 10 which moves and mounts components to substrate 3 by moving mounting heads 9 holding components.

Component recognition camera 6 is arranged between component supply section 4 and substrate conveyance mechanism 2. When mounting head 9 which picked up the component from component supply section 4 moves above component recognition camera 6, component recognition camera 6 images and recognizes the component in the state of being held by mounting head 9. Substrate recognition camera 11 which is positioned on a bottom surface side of X-axis movement beam 8 and moves integrally with each mounting head 9 is mounted to mounting head 9.

Due to the movement of mounting head 9, substrate recognition camera 11 moves above substrate 3 which is positioned in substrate conveyance mechanism 2, and substrate recognition camera 11 images and recognizes the marks (not shown) of substrate 3. In a component mounting operation to substrate 3 carried out by mounting head 9, placement position correction is performed, taking into account recognition results of the component by component recognition camera 6 and substrate recognition results by substrate recognition camera 11.

As illustrated in FIG. 2, wheeled table 12 is set in component supply section 4 in a state in which a plurality of tape feeders 5 is mounted to feeder base 12a in advance. Feeder addresses for specifying a feeder position in which each individual tape feeder 5 is mounted are set in feeder base 12a, and in the component mounting work, the components stored in carrier tape 14 which is set in each tape feeder 5 on feeder base 12a are specified via these feeder addresses.

Supply reels 13 which store carrier tapes 14 storing components in a wound state are held on wheeled table 12 which is mounted to component supply section 4. Carrier tape 14 which is pulled out from supply reel 13 is pitch fed by tape feeder 5 to component suction position of suction nozzle 9a.

Figure 3:
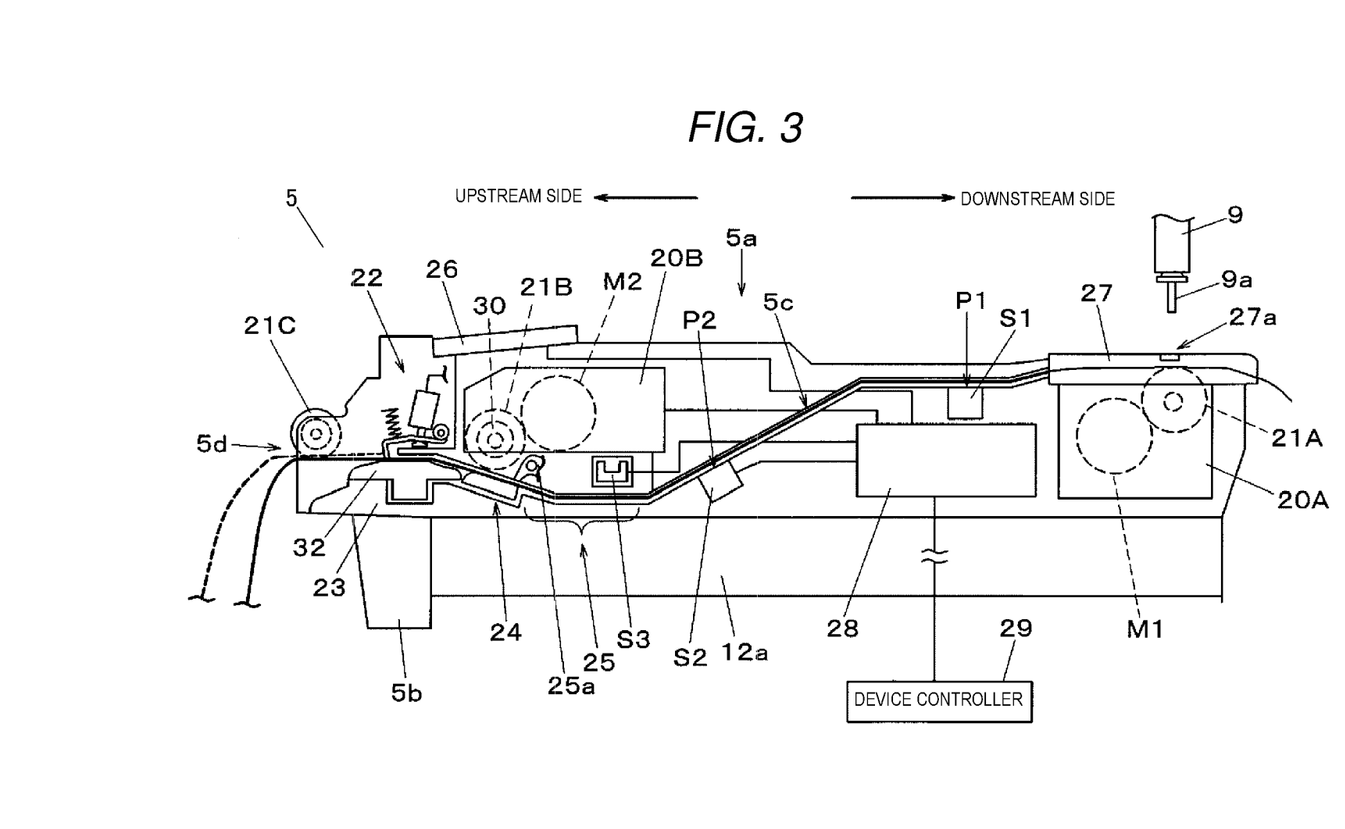
FIG. 3 is a configuration explanation diagram of a tape feeder of the embodiment of the present disclosure.

Next, description will be given of the configuration and functions of tape feeder 5, with reference to FIG. 3. As illustrated in FIG. 3, tape feeder 5 is configured to include mounting section 5b provided to protrude downward from main body section 5a and the bottom surface of main body section 5a. In a state in which tape feeder 5 is mounted with the bottom surface of main body section 5a aligned with feeder base 12a, tape feeder 5 is fixed and mounted to component supply section 4, and feeder controller 28 which is embedded in order to control the tape feeding in tape feeder 5 is electrically connected to device controller 29 of component mounting device 1.

Tape guideway 5c is provided on the inner portion of main body section 5a. Tape guideway 5c guides carrier tape 14 which is pulled out from supply reel 13 and taken into main body section 5a. Tape guideway 5c is provided to communicate from insertion port 5d to the component suction position at which mounting head 9 picks up the components. Insertion port 5d is opened in the upstream end portion of main body section 5a in the tape feed direction and carrier tape 14 is inserted therethrough.

In component mounting device 1 illustrated in the present exemplary embodiment, two carrier tapes 14 are inserted from insertion port 5d and are fed, one in front of the other. Of two carrier tapes 14, carrier tape 14A (hereinafter referred to as leading tape 14A) is already set in tape feeder 5 and is the target of component picking by mounting head 9. Meanwhile, carrier tape 14B (hereinafter referred to as following tape 14B) is set by being newly added when the components run out. In component mounting device 1, a system is adopted in which tape 14A and tape 14B are supplied by being sequentially inserted into insertion port 5d, each remaining in a separated state, without performing tape splicing in which the tail end portion of leading tape 14A and the head end portion of following tape 14B are spliced together using connection tape.

Sprocket 21C with which following tape 14B is set by being newly added engages and gate mechanism 22 are provided in insertion port 5d. Sprocket 21C includes a function of preventing disengagement of following tape 14B by restricting the tape feed direction of following tape 14B. Gate mechanism 22 is positioned on the downstream side of sprocket 21C, and includes a function of allowing or disallowing the entrance of carrier tape 14 which is inserted from insertion port 5d to tape guideway 5c of the downstream side by moving gate 34a (refer to FIG. 5A) of gate drive member 34 up and down in relation to guide member 32 which is fixed to frame section 23 forming main body section 5a.

First tape feed mechanism 20A and second tape feed mechanism 20B which are tape feed mechanisms for tape feeding leading tape 14A and following tape 14B are arranged on the downstream side and the upstream sides in tape guideway 5c, respectively. Second tape feed mechanism 20B which is provided on the upstream side includes a function of successively tape feeding following tape 14B which is newly set from insertion port 5d side to first tape feed mechanism 20A side. Second tape feed mechanism 20B is configured to rotationally drive sprocket 21B using second motor M2.

Tape pushing mechanism 24 and tape stopper mechanism 25 are arranged below second tape feed mechanism 20B. Following tape 14B which is guided and inserted into insertion port 5d via sprocket 21C is pushed into sprocket 21B by tape pushing mechanism 24, and thus, following tape 14B engages with sprocket 21B and enters a state in which tape feeding by second tape pushing mechanism 20B is possible. Tape stopper mechanism 25 includes a function of temporarily stopping the head end portion of following tape 14B, which is newly inserted in a state in which leading tape 14A is mounted, using stopper member 25a.

First tape feed mechanism 20A which is provided on the downstream side includes a function of pitch feeding leading tape 14A to the component suction position of mounting head 9 at a predetermined feed pitch. First tape feed mechanism 20A is configured to rotationally drive sprocket 21A using first motor M1. Retaining member 27 which retains leading tape 14A from above and exposes the components stored in leading tape 14A is mounted above first tape feed mechanism 20A, and the component which is pitch fed to the component suction position is picked up by vacuum suction using suction nozzle 9a of mounting head 9 via component pickup opening 27a formed in retaining member 27.

Figure 4A:
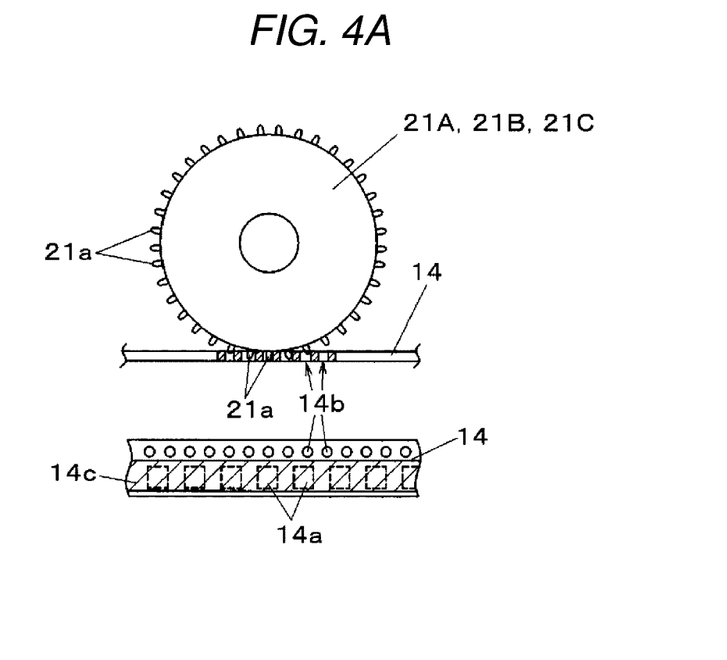
FIGS. 4A to 4D are function explanation diagrams of the sprockets used in a tape feed mechanism in the tape feeder of the embodiment of the present disclosure.

Here, description will be given of the functions of sprockets 21A, 21B, and 21C, with reference to FIGS. 4A to 4D. As illustrated in FIG. 4A, a plurality of feed pins 21a is provided on the outer circumferential surfaces of sprockets 21A, 21B, and 21C. Component pockets 14a which store supply-target components and feed holes 14b into which feed pins 21a engage are formed at a predetermined pitch in carrier tape 14. Cover tape 14c for preventing the disengagement of the stored components is bonded to the range in which component pockets 14a are formed in carrier tape 14. Carrier tape 14 is tape fed due to sprockets 21A and 21B rotating in a state in which feed pins 21a are engaged with feed holes 14b.

Figure 4B:
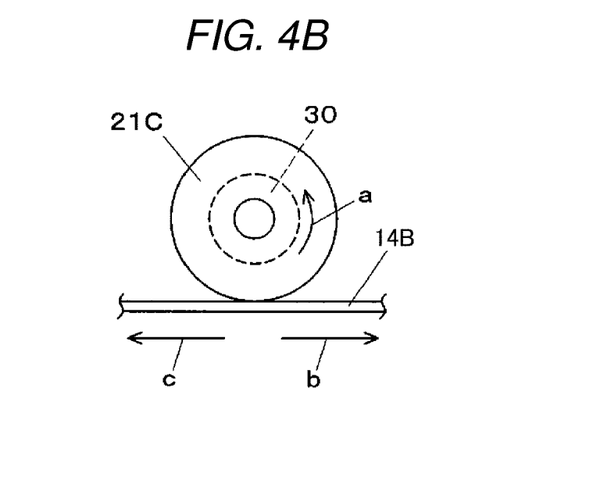

FIG. 4B illustrates the function of sprocket 21C. One-way clutch mechanism 30 is embedded in sprocket 21C, allows rotation in only a rotational direction (arrow a) corresponding to the tape feed direction (arrow b) from the upstream side to the downstream side, and disallows rotation in an opposite direction. Accordingly, following tape 14B is allows to move only in the ordinary tape feed direction (arrow b) and movement in the opposite direction (arrow c) is disallowed in a state in which following tape 14B is engaged with sprocket 21C. Accordingly, even when an external force acts on following tape 14B in a pull-out direction due to the operator's inappropriate handling or the like in a state in which following tape 14B is newly set in order to replenish the components, following tape 14B is locked by sprocket 21C and the disengagement from tape feeder 5 is prevented.

Figure 4C:
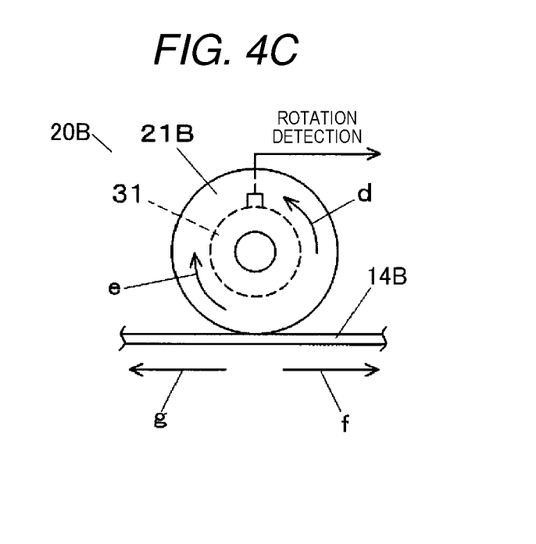

FIG. 4C illustrates the function of sprocket 21B in second tape feed mechanism 20B. As described earlier, sprocket 21B successively tape feeds following tape 14B due to being rotationally driven by second motor M2. Regarding this drive system, when second motor M2 is in an unexcited state of not being subjected to drive control, the idling of sprocket 21B is allowed, and the movement of following tape 14B which is in an engaged state with sprocket 21B is also allowed.

Encoder 31 is embedded in sprocket 21B as rotation detection means, and when following tape 14B moves in the downstream direction (arrow f) or the upstream direction (arrow g), sprocket 21B rotates in the forward direction (arrow d) or the reverse direction (arrow e), respectively, and a rotation detection signal corresponding to the rotation state is transmitted to feeder controller 28. In the present exemplary embodiment, the state of following tape 14B in second tape feed mechanism 20B is determined by monitoring the rotation detection signal which is transmitted to feeder controller 28.

First, when rotation in the forward direction (arrow d direction) of sprocket 21B is detected, it is determined that a new carrier tape 14 is inserted, and the driving of second motor M2 is started in order to perform the tape feeding. Accordingly, the inserted carrier tape 14 is fed to the downstream side along tape guideway 5c. When rotation of sprocket 21B is detected in the reverse direction (arrow e direction) after the rotation is detected in the forward direction (arrow d direction), it is determined that carrier tape 14 which was inserted and engaged with sprocket 21B once has moved in the disengagement direction (arrow g direction) for some reason, and the tape disengagement determination is carried out.

Figure 4D:
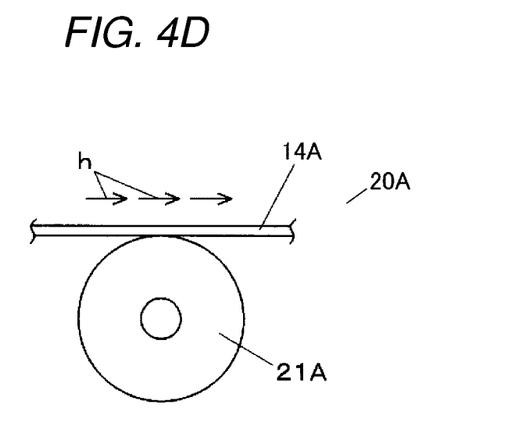

FIG. 4D illustrates the function of sprocket 21A in first tape feed mechanism 20A. As described earlier, sprocket 21A pitch feeds (arrow h) leading tape 14A by a predetermined feed pitch due to being intermittently driven by first motor M1. Accordingly, the component stored in component pocket 14a of carrier tape 14 is supplied to component suction position of mounting head 9.

First detection position P1 for detecting carrier tape 14 is set on the upstream side of first tape feed mechanism 20A in tape guideway 5c, and similarly, second detection position P2 for detecting carrier tape 14 is set on the downstream side of second tape feed mechanism 20B and the upstream side of first detection position P1. First sensor S1 and second sensor S2 which are arranged at first detection position P1 and second detection position P2, respectively, detect whether or not carrier tape 14 is present in first detection position P1 and second detection position P2. Third sensor S3 which detects that following tape 14B is abutting stopper member 25a is arranged in tape stopper mechanism 25.

The detection results of first sensor S1, second sensor S2, and third sensor S3 are transmitted to feeder controller 28, and feeder controller 28 controls first tape feed mechanism 20A and second tape feed mechanism 20B based on these detection results and the rotation detection results of encoder 31. Accordingly, the tape feed operation of leading tape 14A and following tape 14B in tape feeder 5 is executed. Operation and display panel 26 which is disposed on the top surface of the upstream side of tape feeder 5 is connected to feeder controller 28.

Various operation buttons are provided on the operation and display panel 26. The operation buttons include an operation button for performing a tape feed operation and a tape return operation of first tape feed mechanism 20A and second tape feed mechanism 20B, an operation button for gate opening and closing operations in gate mechanism 22, an operation button for performing writing of component IDs to an internal memory of tape feeder 5, and the like. A notification lamp for performing notification of predetermined items which are set in advance is provided on operation and display panel 26.

Figure 5A:
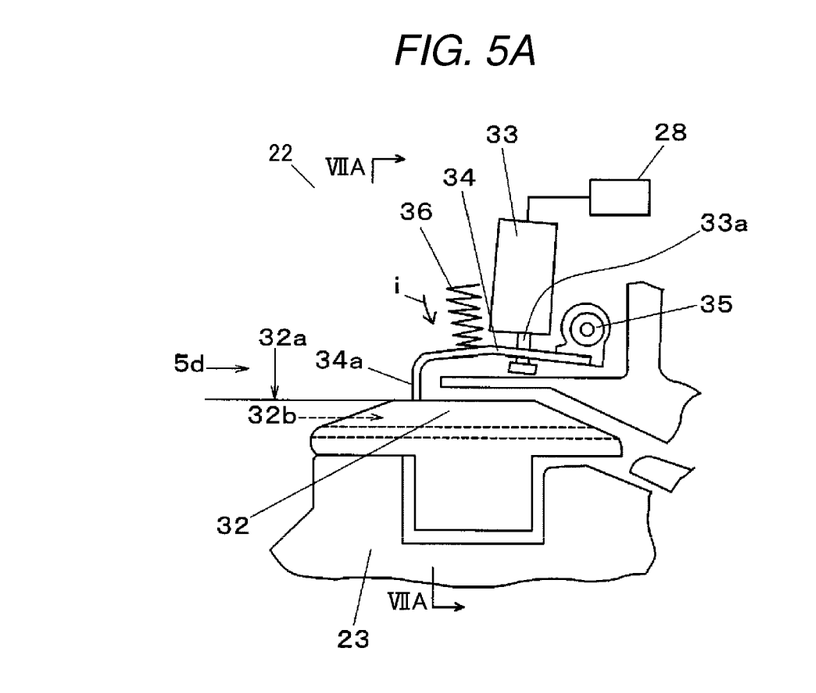
FIGS. 5A and 5B are configuration explanation diagrams of a gate mechanism provided in the tape feeder of the embodiment of the present disclosure.

Next, description will be given of the configuration of gate mechanism 22, with reference to FIGS. 5A and 5B. In FIG. 5A, guide member 32 is fixed to frame section 23 with guide surface 32a aligned with the tape feed height at which carrier tape 14 which is inserted from insertion port 5d is fed. Guide surface 32a of guide member 32 is set to a shape capable of supporting and guiding carrier tape 14 from the bottom surface side (refer to FIGS. 7A to 7C). Guide groove section 32b is formed in guide surface 32a such that it is possible to guide embossed tape with an embossed portion formed on the bottom surface.

Gate drive member 34 is arranged above guide member 32 in a substantially horizontal orientation. The end portion of the downstream side of gate drive member 34 is axially supported by shaft support section 35. Gate 34a which is bent downward is provided on the end portion of the upstream side of gate drive member 34, and the bottom end portion of gate 34a is freely attachable and detachable in relation to guide surface 32a due to gate drive member 34 rotating around shaft support section 35.

Solenoid 33 which is driven by being excited by feeder controller 28 is arranged above gate drive member 34 in an orientation in which drive shaft 33a is caused to protrude downward. Drive shaft 33a is joined to gate drive member 34 so as to be capable of transmitting an upward drive force. Gate drive member 34 is biased downward (arrow i) by spring member 36 which is disposed on the top surface. When solenoid 33 is in a non-excited state, the drive force of solenoid 33 does not act on gate drive member 34. Therefore, gate mechanism 22 enters a closed state in which gate 34a abuts guide surface 32a due to the biasing force of spring member 36. In this state, carrier tape 14 which is inserted from insertion port 5d is disallowed from entering the downstream side by gate 34a which abuts guide surface 32a.

Figure 5B:
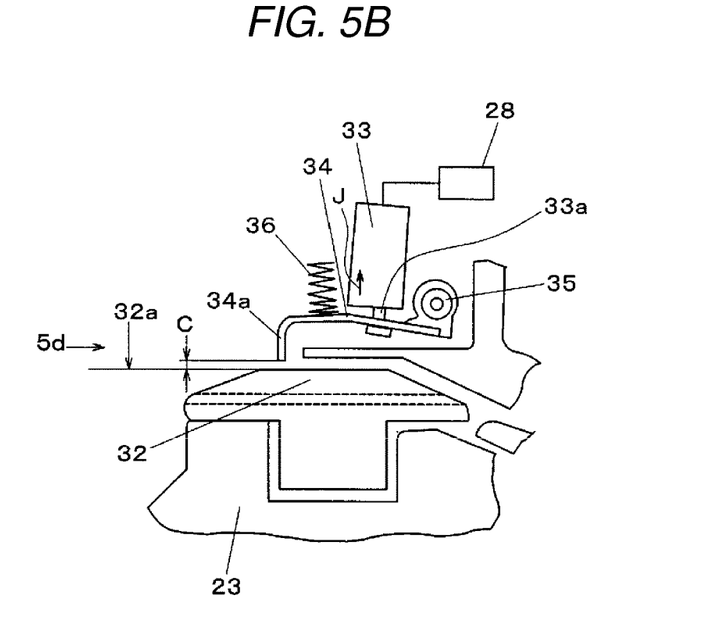

FIG. 5B illustrates a state in which solenoid 33 is driven by the excitation of feeder controller 28 and drive shaft 33a is moved upward (arrow j). Accordingly, gate drive member 34 is displaced upward, predetermined clearance C is secured between the bottom end portion of gate 34a and guide surface 32a of guide member 32, and gate mechanism 22 enters an open state. In this state, carrier tape 14 which is inserted from insertion port 5d is allowed to enter the downstream side by passing through clearance C. In the state in which solenoid 33 is driven by excitation and gate mechanism 22 is opened, operation and display panel 26 or a display lamp arranged on another part is lit, and the fact that gate mechanism 22 is in the open state is displayed. After opening gate mechanism 22 by operating operation and display panel 26, it is possible to set the opening and closing operations such that gate mechanism 22 automatically closes after a predetermined time has elapsed.

In the configuration described above, gate 34a is provided in insertion port 5d through which carrier tape 14 storing components is inserted. Solenoid 33 and spring member 36 form a gate drive mechanism which drives gate 34a in the opening and closing directions. In other words, the gate drive mechanism is configured to include spring member 36 which biases gate 34a in the closing direction, and solenoid 33 which drives gate 34a in the opening direction against the biasing force of spring member 36.

Figure 6A:
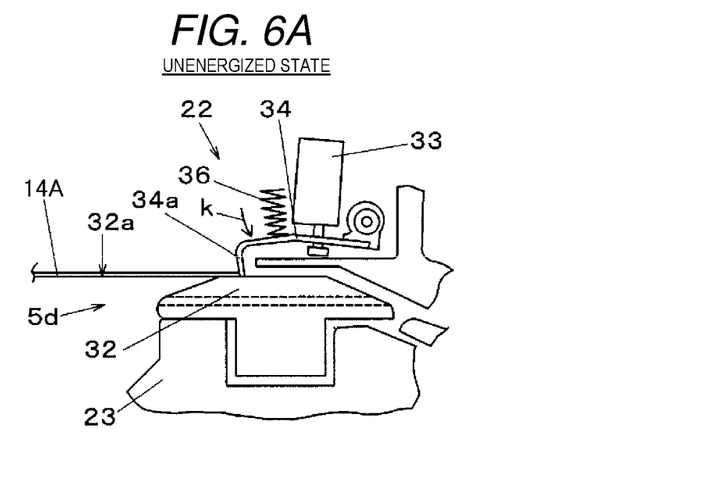
FIGS. 6A to 6C are function explanation diagrams of the gate mechanism provided in the tape feeder of the embodiment of the present disclosure.
Figure 6B:
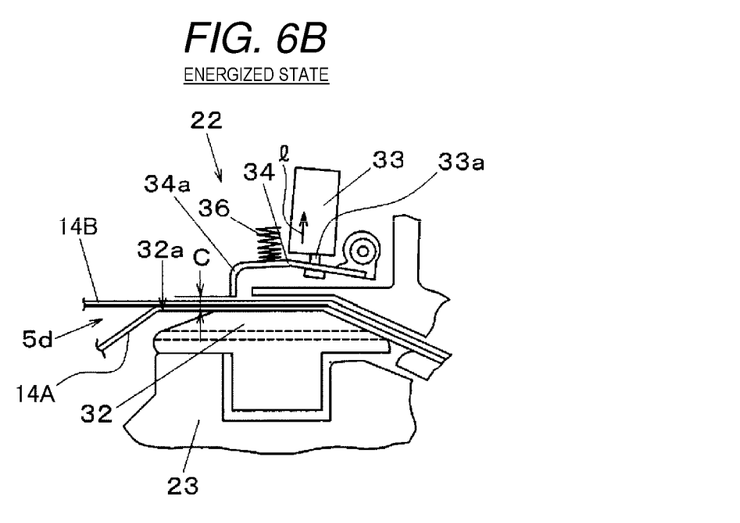
Figure 6C:
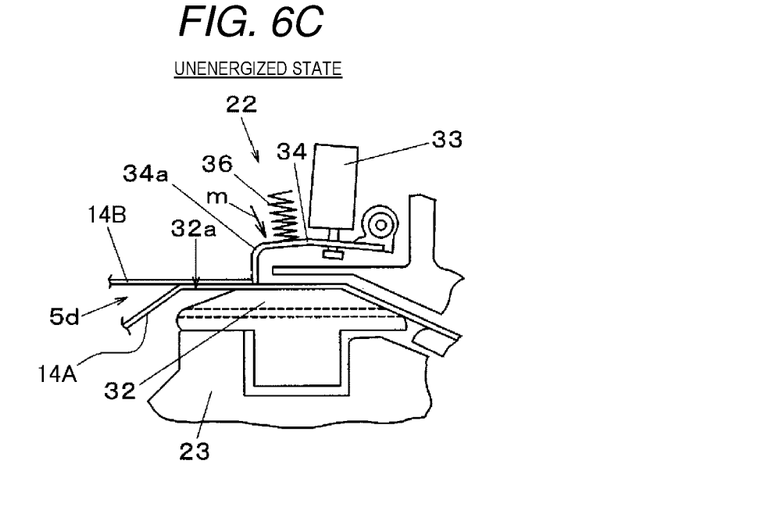

FIGS. 6A to 6C illustrate the appropriate usage of allowing and disallowing of the entry of carrier tape 14 to tape guideway 5c by gate mechanism 22. FIG. 6A illustrates a case in which solenoid 33 is in a non-excited state, that is, gate mechanism 22 is set to the closed state by feeder controller 28, or a case in which solenoid 33 enters an unenergized state in which power is not supplied to tape feeder 5. In this case, gate drive member 34 is pushed down (arrow k) by the biasing force of spring member 36, gate 34a abuts guide surface 32a, and gate drive mechanism 22 enters the closed state. Accordingly, even if an attempt is made to insert carrier tape 14 (here, leading tape 14A) via insertion port 5d, the entrance of carrier tape 14 is disallowed by gate mechanism 22.

FIG. 6B illustrates a case in which tape feeder 5 is in an energized state and solenoid 33 is driven by being excited by feeder controller 28, that is, a case in which the operator uses operation and display panel 26 to set gate mechanism 22 to the open state. In this case, gate drive member 34 is pushed up (arrow l) against the biasing force of spring member 36, and gate 34a enters the open state in relation to guide surface 32a. Accordingly, in a state in which leading tape 14A is inserted via insertion port 5d and tape fed to tape guideway 5c, it is possible to further overlap and insert following tape 14B via clearance C between gate 34a and guide surface 32a.

FIG. 6C illustrates a case in which the unenergized state in which the power source is cut still in a state in which leading tape 14A is being supplied. In this case, since solenoid 33 is in the non-excited state, gate drive member 34 is pushed down (arrow m) by spring member 36, and gate 34a abuts the top surface of leading tape 14A. In this state, even if an attempt is made to insert following tape 14B via insertion port 5d, since gate 34a is in the closed state, the insertion of following tape 14B is disallowed by gate mechanism 22.

Figure 7A:
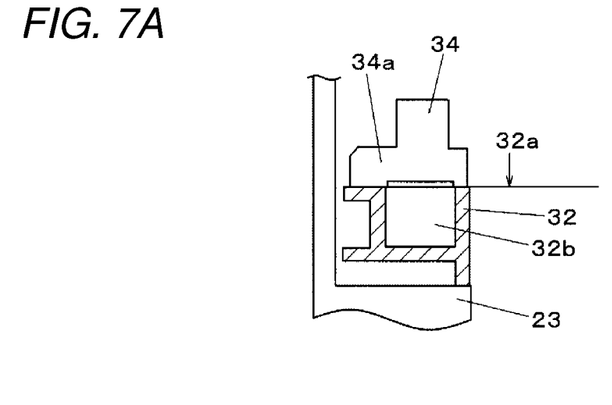
FIGS. 7A to 7C are partial cross-sectional views of the gate mechanism provided in the tape feeder of the embodiment of the present disclosure.
Figure 7B:
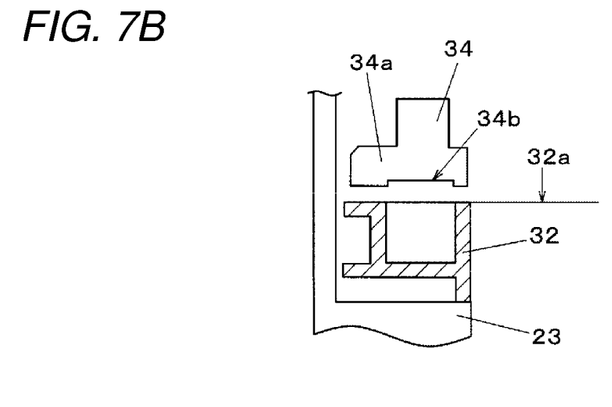
Figure 7C:
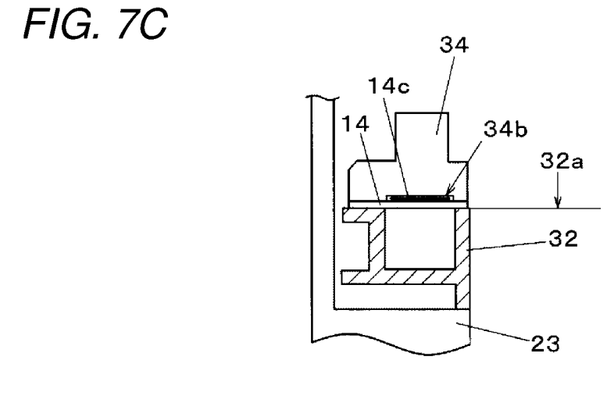

FIGS. 7A to 7C illustrate the details of the shape of the bottom end portion of gate 34a which is provided in gate drive member 34. FIG. 7A illustrates the cross-section taken along line VIIA-VIIA in FIG. 5A, and, as illustrated in FIG. 7B, cut 34b is provided in bottom end portion at which gate 34a abuts guide surface 32a. As illustrated in FIG. 7C, the bottom end portion of gate 34a is a contact portion which contacts the top surface of the inserted carrier tape 14 in a state in which gate 34a is driven in the closing direction with carrier tape 14 in an inserted state.

Cut 34b is provided in the abutting surface in a range including cover tape 14c which is bonded to carrier tape 14, that is, a portion corresponding to the components stored in carrier tape 14. Cut 34b can accommodate the components. By providing this cut 34b, it is possible to prevent damage to the components caused by the abutting surface of gate 34a sliding on cover tape 14c in a state in which gate mechanism 22 is closed and gate 34a is caused to abut the top surface of carrier tape 14. In other words, in cases such as when the components are standing within component pockets 14a in carrier tape 14, there is a risk that the components are in contact with cover tape 14c. Even in such a case, it is possible to prevent damage to the components by providing cut 34b in the contact portion of gate 34a.

As described above, in tape feeder 5 and component mounting device 1 shown in the present exemplary embodiment, the gate drive mechanism which drives gate 34a provided in insertion port 5d through which carrier tape 14 storing components is inserted in the opening and closing directions is formed of spring member 36 which biases gate 34a in the closing direction, and solenoid 33 which drives gate 34a in the opening direction against the biasing force of spring member 36. Accordingly, in the unenergized state, gate 34a is always maintained in the closed state by spring member 36, and the insertion of carrier tape 14 from insertion port 5d is disallowed. Therefore, even when tape feeder 5 is removed from the power source and enters the unenergized state, it is possible to prevent accidental erroneous setting by an operator of carrier tape 14 in tape feeder 5 in which carrier tape 14 should not ordinarily be mounted.

As described above, the tape feeder and the component mounting device of the present disclosure have the effect of being capable of preventing erroneous setting of the carrier tape to the unenergized state tape feeder, and are applicable to the field of component mounting in which components supplied by a tape feeder are mounted to a substrate.

What is claimed is:

1. A tape feeder comprising:
a gate provided in an insertion port through which a carrier tape storing a component is inserted;
a gate drive mechanism which drives the gate in an opening direction and a closing direction; and
a tape feed mechanism which feeds the component stored in the inserted carrier tape to a pickup position along a guide surface aligned with a height at which the carrier tape is fed,
wherein the gate drive mechanism includes: a spring member which biases the gate in the closing direction; and
a solenoid which drives the gate in the opening direction against a biasing force of the spring member, and
wherein the gate drive mechanism biases the gate in the closing direction where the gate abuts the guide surface when the tape feeder is in an unenergized state, and drives the gate in the opening direction which is an opposite direction to the closing direction when the tape feeder is in an energized state when power is supplied to the tape feeder.

2. The tape feeder of claim 1, wherein the gate includes a contact portion which contacts a top surface of the carrier tape that is inserted in a state in which the gate is driven in the closing direction, and wherein the contact portion is provided with a cut capable of accommodating the component stored in the carrier tape.

3. The tape feeder of claim 1, further comprising a gate drive member,
wherein the gate is bent downward and provided on an end portion of an upstream side of the gate drive member, and
both the spring member and a drive shaft of the solenoid are disposed on a top surface of the gate drive member.

4. A component mounting device comprising:
a tape feeder; and
a component mounting mechanism which picks up a component from the tape feeder, moves the component to a substrate, and mounts the component on the substrate,
wherein the tape feeder includes:
a gate provided in an insertion port through which a carrier tape storing the component is inserted;
a gate drive mechanism which drives the gate in an opening direction and a closing direction; and
a tape feed mechanism which feeds the component stored in the carrier tape inserted to a pickup position along a guide surface aligned with a height at which the carrier tape is fed, and
the gate drive mechanism includes:
a spring member which biases the gate in the closing direction; and
a solenoid which drives the gate in the opening direction against a biasing force of the spring member, and
wherein the gate drive mechanism biases the gate in the closing direction where the gate abuts the guide surface when the tape feeder is in an unenergized state, and drives the gate in the opening direction which is an opposite direction to the closing direction when the tape feeder is in an energized state when power is supplied to the tape feeder.

5. The component mounting device of claim 4, further comprising a gate drive member,
wherein the gate is bent downward and provided on an end portion of an upstream side of the gate drive member, and
both the spring member and a drive shaft of the solenoid are disposed on a top surface of the gate drive member.

* * * * *